(12) United States Patent
Lee et al.

(10) Patent No.: US 6,288,493 B1
(45) Date of Patent: Sep. 11, 2001

(54) ANTENNA DEVICE FOR GENERATING INDUCTIVELY COUPLED PLASMA

(75) Inventors: Yong-Kwan Lee; Nam-Sik Yoon, both of Taejon; Sung-Sik Kim, Kyunggi-Do; Pyung-Woo Lee, Kwachon; Hong-Young Chang, Taejon, all of (KR)

(73) Assignees: Jusung Engineering Co., Ltd., Kyunggi-Do; Korea Advanced Institute of Science and Technology, Taejon, both of (KR)

( * ) Notice: Subject to any disclaimer, the term of this patent is extended or adjusted under 35 U.S.C. 154(b) by 0 days.

(21) Appl. No.: 09/562,902

(22) Filed: May 2, 2000

(30) Foreign Application Priority Data

Aug. 26, 1999 (KR) .................................. 99-35702

(51) Int. Cl.[7] ...................................... H05H 1/24
(52) U.S. Cl. ............................. 315/111.51; 315/111.21; 343/895
(58) Field of Search ................. 315/111.51, 111.21; 343/732, 745, 748, 866, 893, 895

(56) References Cited

U.S. PATENT DOCUMENTS

| | | | |
|---|---|---|---|
| 5,587,038 | * 12/1996 | Cecchi et al. ........................ | 156/345 |
| 5,767,628 | * 6/1998 | Keller et al. ..................... | 315/111.51 |
| 5,874,704 | * 2/1999 | Gates ............................... | 219/121.43 |
| 5,900,699 | * 5/1999 | Samukawa et al. ............. | 315/111.51 |
| 5,965,034 | * 10/1999 | Vinogradov et al. ............ | 315/111.21 |
| 6,043,608 | * 3/2000 | Samukawa et al. ............. | 315/111.51 |
| 6,068,784 | * 5/2000 | Collins et al. ........................ | 156/345 |
| 6,127,275 | * 10/2000 | Flamm ................................. | 156/345 |
| 6,165,311 | * 12/2000 | Collins et al. ........................ | 156/345 |
| 6,172,321 | * 1/2001 | Yoshioka et al. ............... | 219/121.41 |

* cited by examiner

*Primary Examiner*—Don Wong
*Assistant Examiner*—Thuy Vinh Tran
(74) *Attorney, Agent, or Firm*—Reed Smith Hazel & Thomas LLP

(57) ABSTRACT

The invention relates to an antenna device of a low impedance for generating a large quantity of inductively coupled plasma to process a large size of a specimen with adjustment for a uniform distribution in the density of plasma, comprising: a high frequency power source; a first antenna for receiving the high frequency power supplied from the high frequency power source; and a second antenna connected in parallel with the first antenna for receiving the high frequency power supplied from the high frequency power source, wherein a resonant state is kept between the first and second antennas.

23 Claims, 7 Drawing Sheets

ANTENNA DEVICE FOR GENERATING INDUCTIVELY COUPLED PLASMA

BACKGROUND OF THE INVENTION

1. Field of the Invention

The present invention relates to an antenna device for generating plasma, and more particularly to an antenna device for generating inductively coupled plasma which can covers a large effective area to process a large specimen in a high, uniform density of plasma.

2. Description of the Prior Art

In order to produce a fine pattern on a substrate like a semiconductor wafer, flat panel display or the like in a technical field of fabricating a semiconductor device, plasma is generated to perform a variety of surface treatment process like dry etching process, chemical vapor deposition process, sputtering and the like. In order to reduce cost and improve throughput, the size of a semiconductor wafer and that of a substrate for a flat panel display has shown a tendency of getting larger, for instance, over 300 mm in recent years. Accordingly, a device for generating plasma to process such a large wafer or substrate also gets larger.

Therefore, there have been plasma sources to be operated by high frequency power in a diode type, microwave type or radio frequency wave type and the like. In this regard, there are problems in the diode type plasma source like a difficulty in controlling high voltage and requirement of a high level of gas pressure, so that the diode type plasma source has not been suitable for processing such a fine pattern. Even if an electron cyclotron resonance ("ECR") type plasma source is advantageous in obtaining a high density plasma under a low pressure, it is disadvantageous in achieving a uniform distribution of plasma. Such a problem gets more severe as the size of plasma increases. Furthermore, according to a helicon wave type plasma source, a kind of radio wave type plasma source called an inductively coupled type, the energy in electric and magnetic fields are combined and excited to be able to generate a high density plasma in uniform distribution. However, in case the size of plasma increases, the helicon wave type plasma source is not suitable for achieving a uniform density distribution of plasma.

A general antenna device for generating inductively coupled plasma will be briefly described with reference to FIG. 1. The device for generating plasma 10 (hereinafter referred to as plasma generating device) has a chamber 104 in which plasma is generated, wherein the chamber 104 includes a gas inlet opening 110 for supplying reactant gas, a vacuum pump 112 for keeping the internal part of the chamber in a vacuum state and a gas outlet opening 114 for exhausting reactant gas after reaction. In addition, there is a chuck 108 on which a specimen 112 like wafer, glass substrate or the like will be placed in the chamber 104. An antenna 100 connected with a high frequency power source 102 is installed on the chamber 104. An insulating plate 116 is installed between antenna 100 and chamber 104 for decreasing capacitive coupling characteristic, which helps transmission of energy from the high frequency power source 102 to plasma 118 through the inductive coupling.

The plasma generating device 100 thus constructed generates plasma in a method which will be described below. In other words, all the air filling in the internal part of the chamber 104 is discharged out with a vacuum pump 112 to get to a vacuum state at the first step. A reactant gas is infused for generating plasma through the gas inlet opening 110, and the chamber 104 is kept at a necessary level of gas pressure. Then, the high frequency power of 13.56 MHz is applied to the antenna device 100 from the high frequency power source 102.

As shown in FIGS. 2a and 2b, the conventional plasma generating device is constructed with a spiral shaped antenna 200 or a plurality of (for instance, three) divided electrode type antennas 202a, 202b and 202c. Therefore, with high frequency power, a vertical magnetic field is formed along with changes of time at a plane horizontal to the antenna 100. The magnetic field that changes in time as such forms an inductive electric field at the internal part of the chamber 104. When electrons are heated and induced to an electric field to thereby generate plasma inductively coupled with the antenna 100. As described above, electrons are collided with neighboring neutral gas particles to generate ions and radicals and the like which will be used for plasma etching and deposition processes. In addition, if power is applied to the chuck 108 from a separate high frequency power source (not shown), it is possible to adjust the energy of ions which will be applied to the specimen 106.

As shown in FIG. 2a, a number of wires to form a spiral shaped antenna 200 are connected in series, keeping flow of current constant in each wire. In this case, it is difficult to control distribution of inductive electric fields, and ions and electrons are lost at the internal wall of the chamber 104. Therefore, a high density of plasma is formed at the central part of the plasma 118, but a low density of plasma is formed at the part close to the internal wall of the chamber 104. As a result, it is extremely difficult to achieve uniformity in the density distribution of the plasma 118.

Furthermore, as all the wires of the antenna 200 are connected in series, there may be a great voltage drop which may increase the influence of a capacitive coupling characteristic with the plasma 118. As a result, the electrical efficiency of the antenna 200 decreases and it is difficult to keep uniformity in the density distribution of plasma.

Next, as shown in FIG. 2a, in the antenna constructed with three separate electrodes respectively connected with three different phases of high frequency power sources 204a, 204b and 204c, the density of plasma is generally high, but the density of plasma decreases at a part close to the center of the chamber 104. It is also difficult to ensure the uniformity in the density distribution of plasma, and it is more difficult to treat a large size of a specimen. In addition, application of separately operated power results in increase in cost because an independent impedance matching circuit should be used for separate electrodes to achieve an impedance matching state for efficient uses of power.

SUMMARY OF THE INVENTION

It is an object of the present invention to solve the aforementioned problems and provide an antenna device for generating a large quantity of plasma for processing a large size of a specimen.

It is another object of the present invention to provide an antenna device for generating a uniform distribution of plasma.

In order to accomplish the aforementioned objects of the present invention, there is provided an antenna device for generating a large quantity of plasma comprising:

a high frequency power source;

a first antenna for receiving the high frequency power supplied from the high frequency power source; and a second antenna connected in parallel with the first antenna for receiving the high frequency power supplied from the high frequency power source, wherein a resonant state is kept between the first and second antennas.

BRIEF DESCRIPTION OF THE DRAWINGS

Objects and aspects of the invention will become apparent from the following description of preferred embodiments with reference to the accompanying drawings in which.

DETAILED DESCRIPTION OF THE PRESENT INVENTION

Preferred embodiments of the present invention will be described in detail with reference to accompanying drawings.

Figure 1:
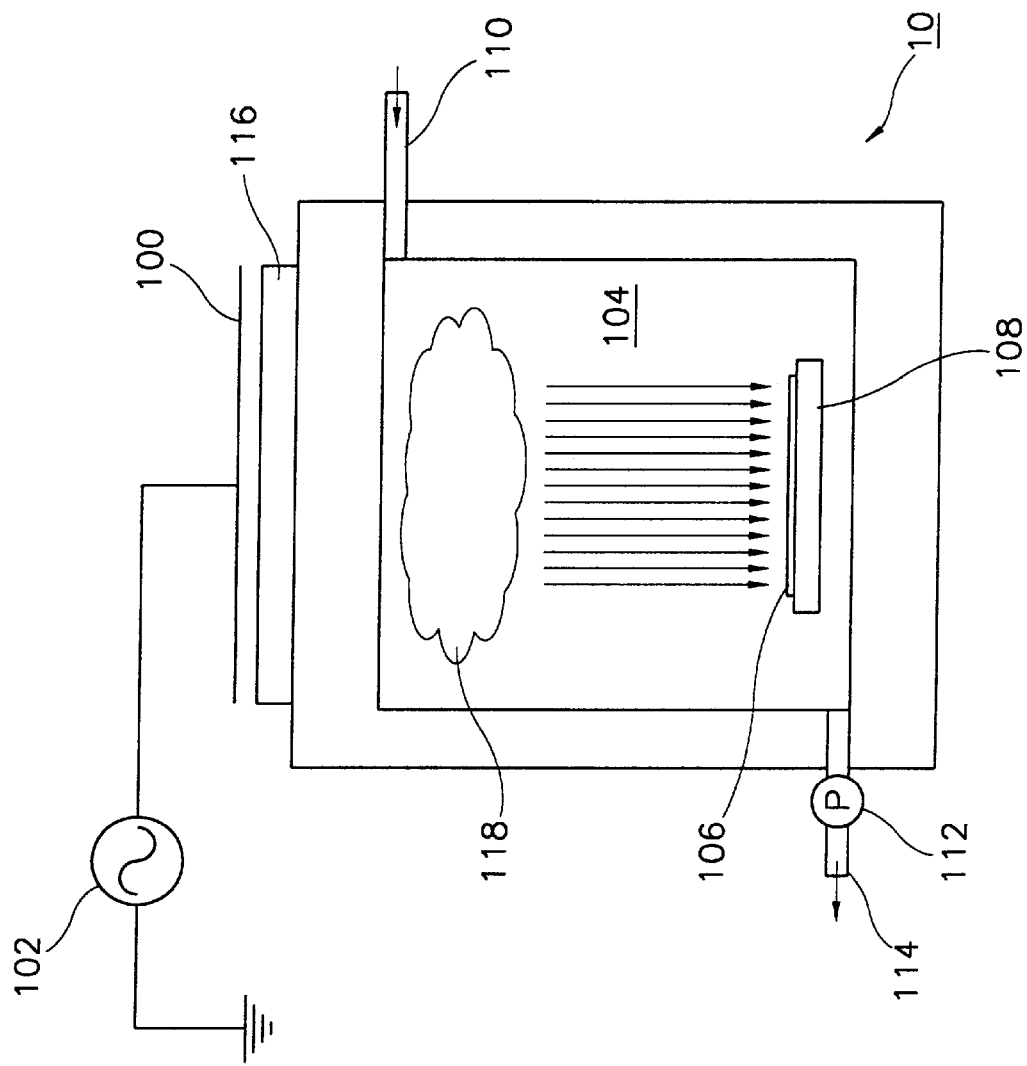
FIG. 1 is a schematic view for illustrating a conventional device for generating inductively coupled plasma.
Figure 2A:
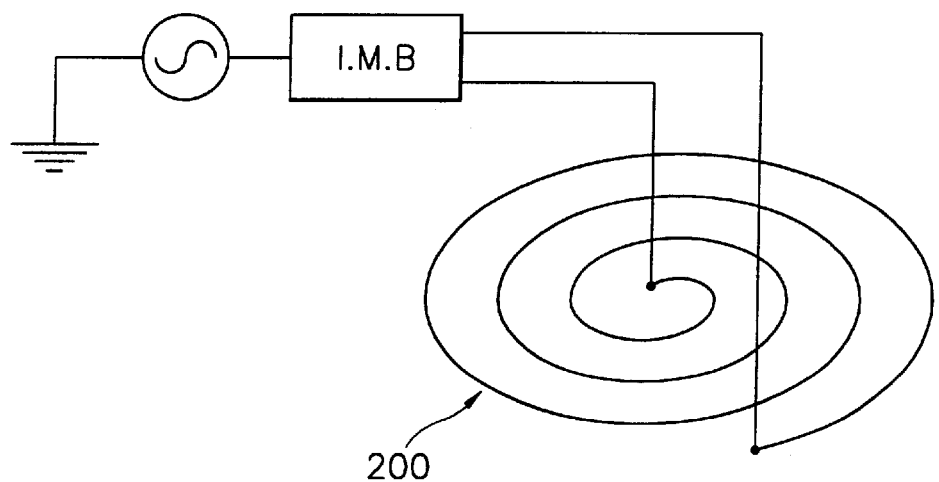
FIGS. 2a and 2b are schematic views for illustrating a conventional antenna device for generating inductively coupled plasma.
Figure 2B:
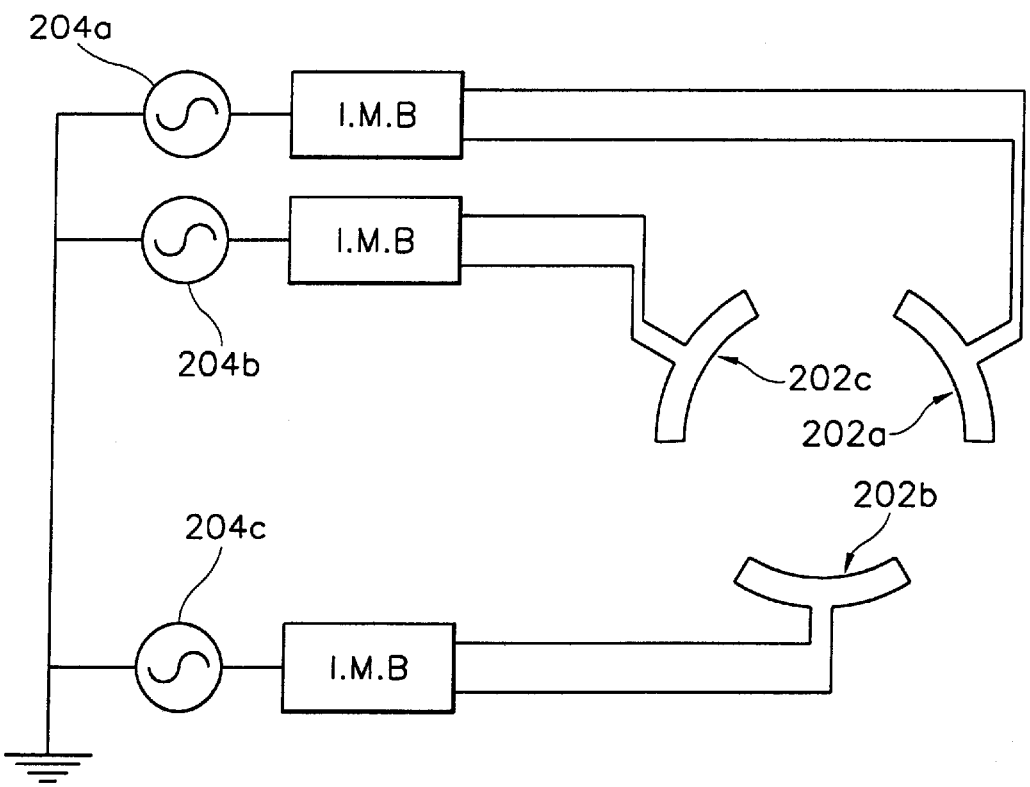
Figure 3A:
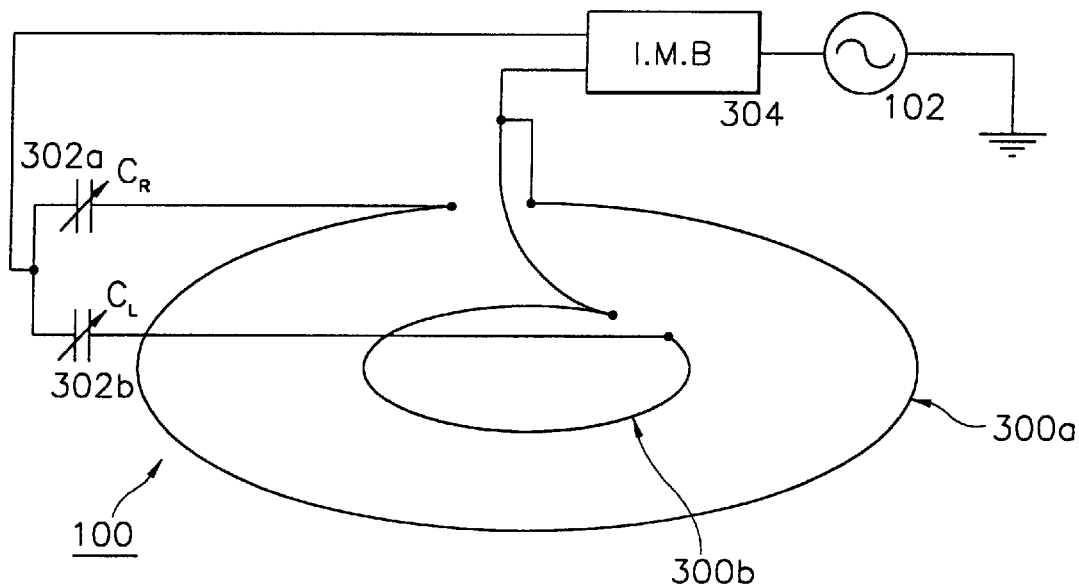
FIGS. 3a and 3b are schematic views for illustrating antenna devices for generating inductively coupled plasma in accordance with an embodiment of the present invention.
Figure 4A:
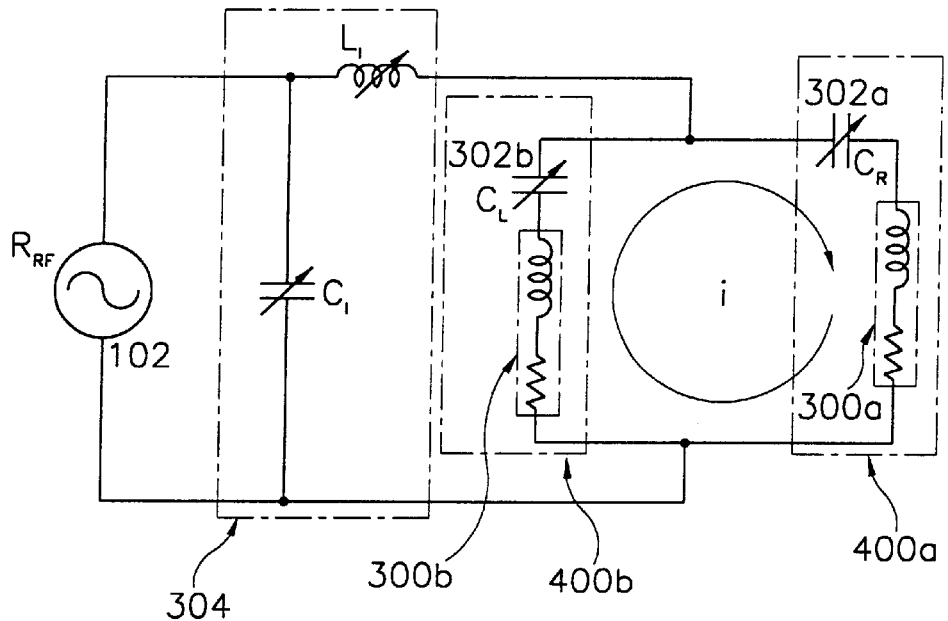
FIGS. 4a and 4b are equivalent circuit diagrams of antenna devices shown in FIGS. 3a and 3b.

FIG. 3a is a conceptual view for illustrating an antenna device for generating inductively coupled plasma in accordance with an embodiment of the present invention, and FIG. 4a is an equivalent circuit diagram of an antenna device shown in FIG. 3a. As shown in FIGS. 3a and 4a, an antenna device 100 of the present invention includes a plurality of antenna units 400a and 400b connected in parallel with each other, which respectively include variable loads 302a and 302b and single or multi-wires of antennas 300a and 300b. In the antennas 300a and 300b, reference symbols $R_1$, $R_2$, and $L_1$, $L_2$ indicate resistance and equivalent inductance of respective antennas and capacitance of the antennas is absorbed and designated by reference symbols $C_R$, $C_L$ respectively for resonance variable capacitance and variable load capacitance.

In addition, the antenna device 100 also includes an impedance matching circuit (impedance matching box: IMB) 304 for achieving an impedance matching state between a plurality of antenna units 400a and 400b and the high frequency power source 102. At this time, a plurality of antenna units 400a, 400b are kept in the resonant state by the variable load of the variable capacitor $C_R$ 302a, which is the most important feature of the present invention. As shown in FIG. 4a, the resonant state of the antenna device 100 will be described in detail in accordance with the present invention.

FIG. 4a is an equivalent circuit diagram of the antenna device shown in FIG. 3a. In other words, power is supplied through the impedance matching circuit 304 connected with the high frequency power source 102. The first antenna unit 400a includes a first variable load 302a and a first antenna 300a connected in series, and the second antenna unit 400b includes a second variable load 302b and a second antenna 300b connected in series. Both of the first and second antenna units 400a, 400b are connected in parallel. In order to set an imaginary part of the equivalent impedance of the first and second antenna units 400a, 400b to be zero, the magnitude of the first variable load 302a can be adjusted. As shown in the drawings, the variable capacitor $C_R$ is used for easy adjustment of capacitance. If such a resonant state is made, the magnitude of current flowing in the first and second units 400a, 400b becomes equal. Referring to FIG. 3a again, through the aforementioned process, the current level of the first antenna unit 400a positioned outside of the second antenna unit 400b increases.

Next, a general impedance method is used for maximizing transmission of energy from the high frequency power source 102 to the first and second antenna units 400a, 400b. In other words, the total variable load determined at the first and second antenna units 400a, 400b can be considered as a regular load. As a result, it is possible to make an impedance matching circuit 304 for achieving an equivalent impedance matching state. The impedance matching circuit 304 can be constructed in a method which has been already widely known in the same technical field, for instance, in a simple circuit in which a variable inductor $L_I$ and variable capacitor $C_I$ are connected in parallel.

In other words, in the antenna device 100 of the present invention, the magnitude of the variable load 302b is first determined to control the level of energy transmitted by the second antenna 300b to plasma. The magnitude of the resonance variable load 302a is determined to form a resonant state between the first and second antennas 300a, 300b, and then an impedance matching state is achieved by the IMB 304. As a result, it is possible to efficiently transmit the energy supplied from the high frequency power source 102 to plasma 118 in the chamber 104 with an improved uniformity in the density of plasma.

Figure 3B:
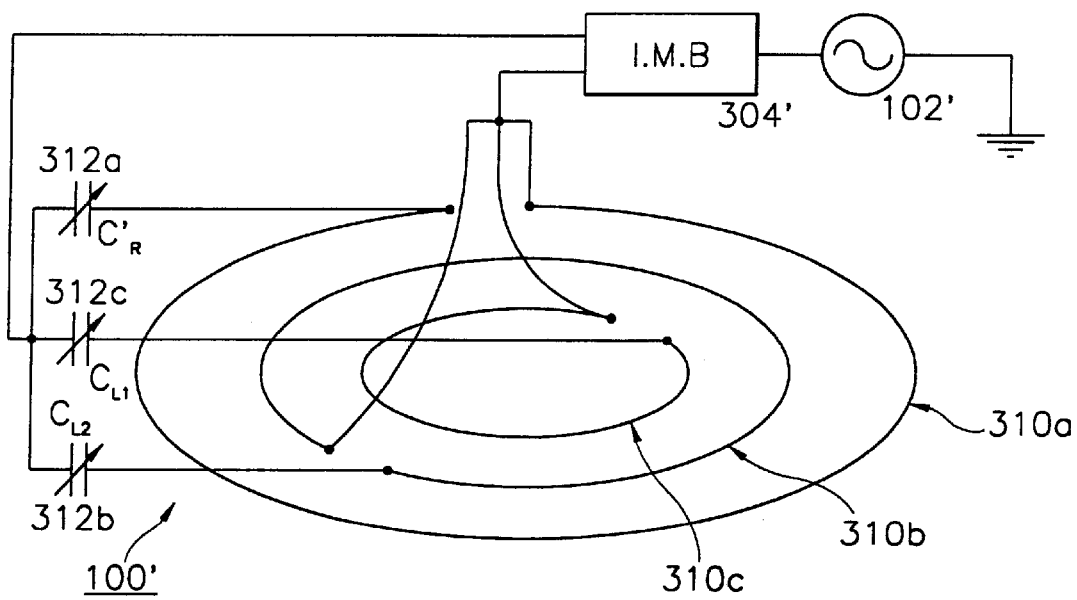
Figure 4B:
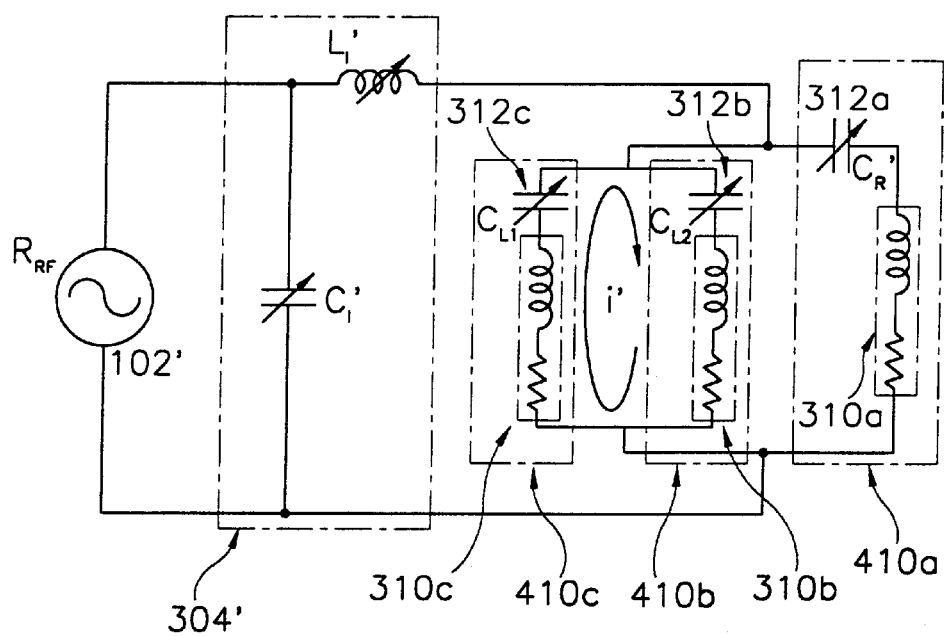

Next, another embodiment of the present invention will be described with reference to FIGS. 3b and 4b. As shown in the drawings, in order to provide an operational condition to make it possible to keep a resonant state, the antenna device 100' of the present invention can be constructed with a predetermined number of antenna units 410a, 410b, 410c. According to this embodiment of the present invention, the antenna device 100' is constructed with three antenna units. As shown in the equivalent circuit in FIG. 4b, antenna units 410a, 410b, 410c respectively includes variable loads 312a, 312b, 312c. The magnitude of the variable loads 312b and 312c attached in the two antenna units 410b, 410c are controlled to adjust a ratio of current flowing in the antenna units 310b, 310c. On the other hand, the rest antenna unit 310a is used for achieving a resonant state to the circuit. In this embodiment, the antenna unit 310a for keeping a resonant state is formed as an outermost wire and the rest of antenna units 310b, 310c are formed as internal wires. Therefore, it is possible to conveniently improve the uniform distribution of energy in the entire antenna device. Further, it is noted that the variable load 312b or 312c of the internal antenna units 410b, 410c can be omitted in a particular embodiment of the present invention.

In addition, as described above, the impedance matching state of the antenna units 410a, 410b, 410c with the high frequency power source 102' should be achieved to maximize the quantity of the energy to be supplied to the entire antenna units 410a, 410b, 410c by using the impedance matching circuit 304' having, for example, inductance $L_I'$ and capacitance $C_I'$.

In the antenna device 100' constructed in accordance with the second embodiment of the present invention, a large size of plasma can be conveniently formed with a uniform density distribution.

Figure 5:
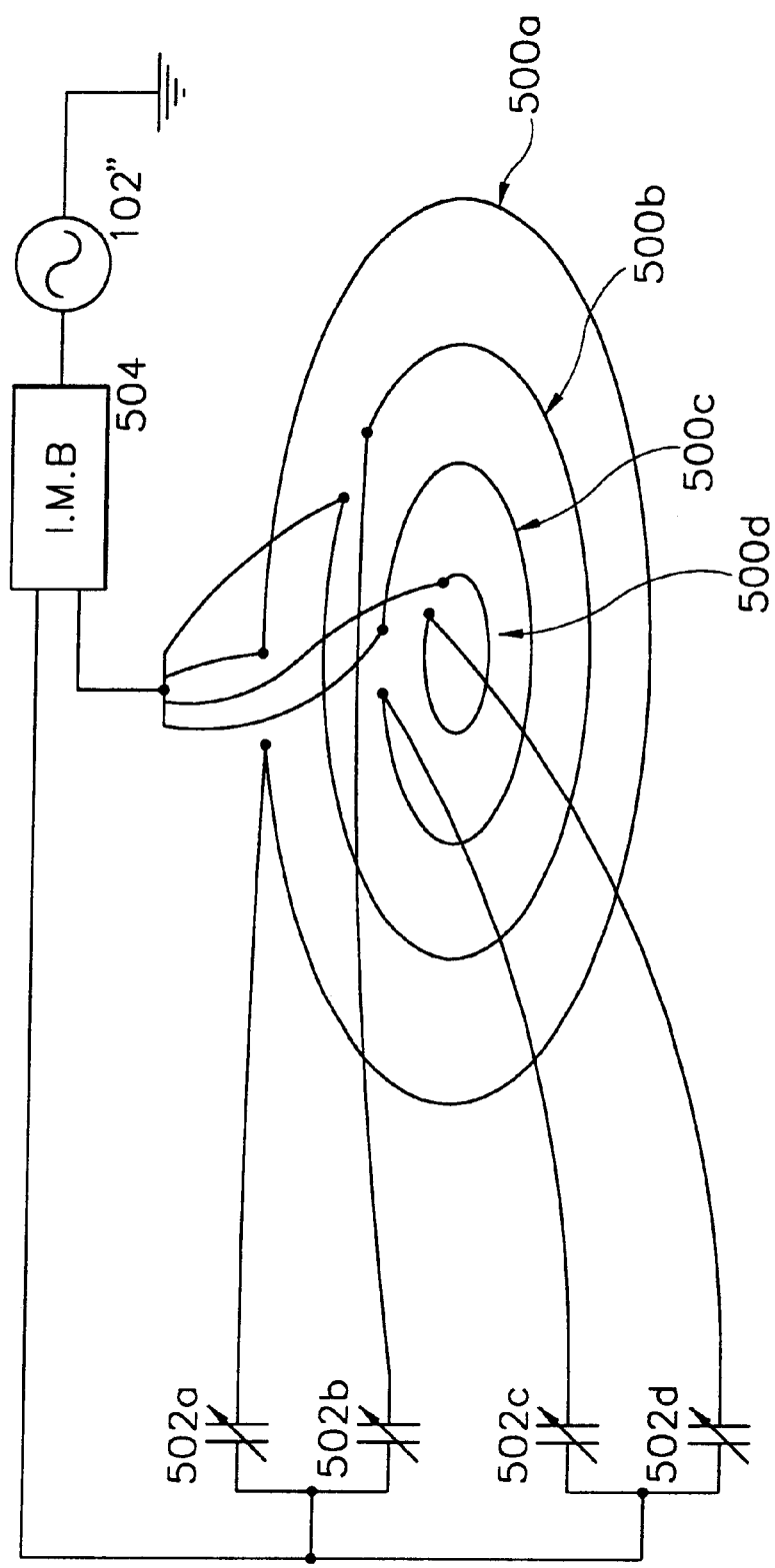
FIG. 5 is a schematic view for illustrating an antenna device for generating inductively coupled plasma in accordance with another embodiment of the present invention.
Figure 6A:
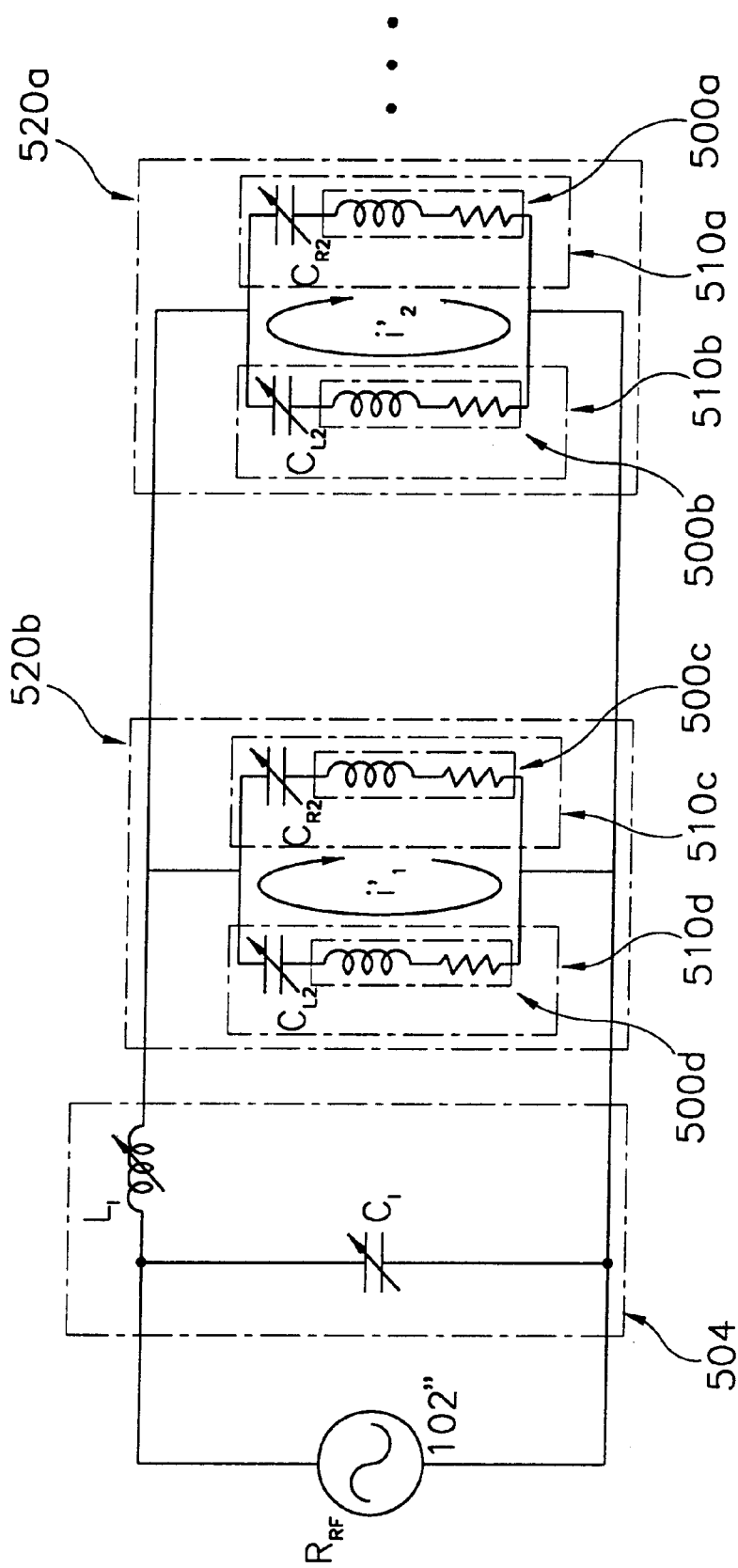
FIGS. 6a and 6b are equivalent circuit diagrams for illustrating an antenna device for generating inductively coupled plasma.

Next, another embodiments of the present invention will be described with reference to FIGS. 5 and 6. As shown in FIG. 5, another embodiment of the present invention is presented with an additional set of antenna unit constructed in the same structure as those of 400a and 400b of the antenna device 100 shown in FIG. 3. The equivalent circuit diagram of the antenna device 500 shown in FIG. 6 includes a first set of antenna units 520a having first and second antenna units 510a, 510b and a second set of antenna units 520b having third and fourth antenna units 510c, 510d. Variable loads, as in the other embodiment of the present invention, can be imposed onto all of the antenna units 510a, 510b, 510c, 510d. Particularly, the resonant state is kept between the antenna units 510a and 510b, 510c and 510d of the respective sets of antenna units 520a, 520b by adjusting the magnitude of the resonance variable load $C_{R1}$ or $C_{R2}$. Furthermore, transmission of energy is maximized by using the impedance matching circuit 504 connected between the entire sets of antenna units 520a, 520b and the high frequency power source 102'.

Even if the device is shown to be constructed with two sets of antenna units in the embodiment of the present invention, the number of antenna sets can be controlled for increasing the size of plasma and adjusting uniformity in the density distribution of plasma more precisely. However, it is not necessary to limit the number of the antenna units included in the respective set of antenna units. In addition, it is the most important to note that in this embodiment a resonant state may not be established in the set of antenna units 520b positioned inside. In consequence, the uniformity in the density distribution of plasma can be improved by supplying a lower level of power to plasma from the antenna set 520b than that from the antenna set 520a positioned outside. The greater quantity of power can be also supplied by keeping the set of external antenna units 520a at a resonant state.

Figure 6B:
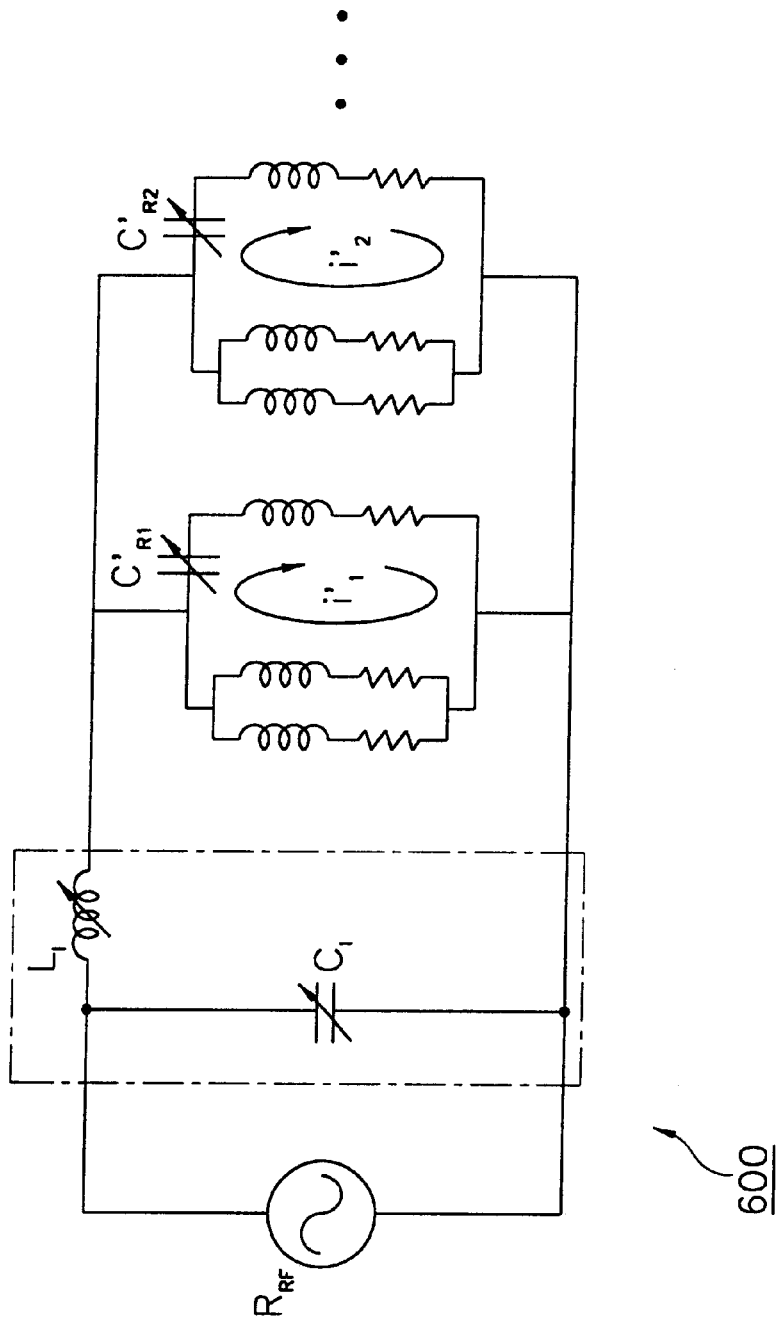

FIG. 6b illustrates an antenna device 600 having two or more sets of antenna units, wherein the sets of antenna units respectively include three antenna units. As shown in FIG. 6b, all the descriptions on the level of energy to be supplied to each antenna unit and formation of an impedance matching state with the high frequency power source are the same or similar to the aforementioned embodiments of the present invention.

Therefore, there are advantages in the antenna device for generating inductively coupled plasma in that an impedance mismatching state does not result from an increase in the size of the antenna device, and uniformity in the density distribution of plasma is achieved by inducing a resonant state into the antenna device through selective adjustment of the level of the energy to be transmitted through particular antennas.

Even if specific preferred embodiments of the invention has been described above, it should be understood that the invention is not limited to those precise embodiments, and that various changes and modifications may be effected therein by one skilled in the art without departing from the scope or spirit of the invention as defined in the appended claims.

What is claimed is:

1. An antenna device for generating a large quantity of plasma, comprising:
   a high frequency power source; and
   at least one antenna circuit set each having:
   a first antenna for receiving a high frequency power supplied from the high frequency power source; and
   a second antenna connected in parallel with the first antenna for receiving the high frequency power supplied from the high frequency power source, wherein the antenna circuit set composed of the first and second antennas is maintained in a resonant state such that an imaginary part of an equivalent impedance of the circuit is ZERO.

2. The device, as defined in claim 1, wherein the second antenna is connected with a variable load for adjusting the circuit in said resonant state.

3. The device, as defined in claim 2, further comprising an impedance matching circuit assembled for providing an impedance matching state between the high frequency power source and the antennas.

4. The device, as defined in claim 1, wherein a third antenna is connected in parallel with the first and second antennas.

5. The device, as defined in claim 4, further comprising an impedance matching circuit assembled for providing an impedance matching state between the high frequency power source and the antennas.

6. The device, as defined in claim 4, wherein the antenna circuit set in the resonant state further includes the third antenna.

7. The device, as defined in claim 6, further comprising an impedance matching circuit assembled for providing an impedance matching state between the high frequency power source and the antennas.

8. The device, as defined in claim 1 further comprising an impedance matching circuit assembled for providing an impedance matching state between the high frequency power source and the antennas.

9. An antenna device for generating a large quantity of plasma comprising:
   a high frequency power source;
   a first antenna set having first and second antennas connected in parallel for receiving a high frequency power supplied from the high frequency power source; and
   a second antenna set having third and fourth antennas connected in parallel for receiving the high frequency power supplied from the high frequency power source and being connected in parallel with the first antenna set,
   wherein at least the first antenna set composed of the first and second antennas is maintained in a resonant state such that an imaginary part of an equivalent impedance of the first antenna set is ZERO.

10. The device, as defined in claim 9, wherein the second antenna is connected with a variable load for adjusting the resonant state of the first antenna set.

11. The device, as defined in claim 10, wherein a resonant state is maintained between the first and second antenna sets such that an imaginary part of an equivalent impedance between the first and second antenna sets is ZERO.

12. The device, as defined in claim 10, further comprising an impedance matching circuit assembled for providing an impedance matching state between the high frequency power source and the first and second antenna sets.

13. The device, as defined in claim 9, wherein the second circuit composed of the third and fourth antennas is maintained in a resonant state such that an imaginary part of an equivalent impedance of the second antenna set is ZERO.

14. The device, as defined in claim 13, further comprising an impedance matching circuit assembled for providing an impedance matching state between the high frequency power source and the first and second antenna sets.

15. The device, as defined in claim 13, wherein the fourth antenna is connected with a variable load for adjusting the resonant state of the second antenna set.

16. The device, as defined in claim 15, further comprising an impedance matching circuit assembled for providing an impedance matching state between the high frequency power source and the first and second antenna sets.

17. The device, as defined in claim 15, wherein a resonant state is maintained between the first and second antenna sets such that an imaginary part of an equivalent impedance between the first and second antenna sets is ZERO.

18. The device, as defined in claim 13, wherein a resonant state is maintained between the first and second antenna sets such that an imaginary part of an equivalent impedance between the first and second antenna sets is ZERO.

19. The device, as defined in claim 9, wherein a fifth antenna is connected in parallel with the first and second antennas.

20. The device, as defined in claim 19, further comprising an impedance matching circuit assembled for providing an impedance matching state between the high frequency power source and the first and second antenna sets.

21. The device, as defined in claim 19, wherein a resonant state is maintained between the first and second antenna sets such that an imaginary part of an equivalent impedance between the first and second antenna sets is ZERO.

22. The device, as defined in claim 9 further comprising an impedance matching circuit assembled for providing an impedance matching state between the high frequency power source and the first and second antenna sets.

23. The device, as defined in claim 9 wherein a resonant state is maintained between the first and second antenna sets such that an imaginary part of an equivalent impedance between the first and second antenna sets is ZERO.

* * * * *